United States Patent
Jan et al.

(10) Patent No.: US 11,054,865 B2
(45) Date of Patent: Jul. 6, 2021

(54) HINGE MODULE AND ELECTRONIC DEVICE

(71) Applicants: Cheng-Shiue Jan, Taipei (TW); Wei-Hao Lan, Taipei (TW)

(72) Inventors: Cheng-Shiue Jan, Taipei (TW); Wei-Hao Lan, Taipei (TW)

(73) Assignee: COMPAL ELECTRONICS, INC., Taipei (TW)

( * ) Notice: Subject to any disclaimer, the term of this patent is extended or adjusted under 35 U.S.C. 154(b) by 0 days.

(21) Appl. No.: 16/177,438

(22) Filed: Nov. 1, 2018

(65) Prior Publication Data

US 2019/0146560 A1    May 16, 2019

Related U.S. Application Data

(60) Provisional application No. 62/581,040, filed on Nov. 3, 2017, provisional application No. 62/584,891, filed on Nov. 12, 2017.

(51) Int. Cl.
*G06F 1/16* (2006.01)
*H05K 5/00* (2006.01)
*H05K 5/02* (2006.01)

(52) U.S. Cl.
CPC .......... *G06F 1/1681* (2013.01); *G06F 1/1618* (2013.01); *G06F 1/1679* (2013.01); *H05K 5/0017* (2013.01); *H05K 5/0226* (2013.01)

(58) Field of Classification Search
CPC .... G06F 1/1681; G06F 1/1688; G06F 1/1618; G06F 1/166; G06F 1/1616; E05D 11/06; E05D 7/00; E05Y 2900/606
See application file for complete search history.

(56) References Cited

U.S. PATENT DOCUMENTS

| | | | |
|---|---|---|---|
| 882,721 A * | 3/1908 | Soss | E05F 3/20 16/68 |
| 2,040,279 A * | 5/1936 | Soss | E05D 3/186 16/273 |

(Continued)

FOREIGN PATENT DOCUMENTS

| CN | 201206595 | 3/2009 |
|---|---|---|
| TW | M545173 | 7/2017 |

OTHER PUBLICATIONS

"Office Action of Taiwan Counterpart Application", dated Mar. 24, 2020, p. 1-p. 8.

*Primary Examiner* — Adrian S Wilson
*Assistant Examiner* — Theron S Milliser
(74) *Attorney, Agent, or Firm* — JCIPRNET

(57) ABSTRACT

A hinge module and an electronic device are provided. The hinge module includes a pair of brackets, a plurality of tabs, a torque providing assembly, and a torque adjustment member. Each bracket has at least one first sliding slot extending along a first direction and a first through hole extending along a second direction, wherein the first direction and the second direction are perpendicular to each other. The tabs pass through the corresponding ones of the first sliding slots, and the tabs have second sliding slots extending along the second direction. The torque providing assembly has a first end connected to one of the brackets and one of the tabs and a second end connected to the other one of the brackets and the other one of the tabs. The torque adjusting member inserts into the first through holes of the brackets and the second sliding slots of the tabs.

19 Claims, 14 Drawing Sheets

(56) References Cited

U.S. PATENT DOCUMENTS

| | | | | |
|---|---|---|---|---|
| 2,608,713 | A | * | 9/1952 | Soss ........................ E05D 3/186 16/337 |
| 3,881,221 | A | * | 5/1975 | Schmidt .................. E05D 3/186 16/366 |
| 4,875,252 | A | | 10/1989 | Falconer et al. |
| 5,491,874 | A | * | 2/1996 | Lowry ................... G06F 1/1616 16/337 |
| 8,246,014 | B2 | * | 8/2012 | Jien ......................... B63B 17/04 256/59 |
| 10,100,970 | B1 | * | 10/2018 | Wu ........................ G06F 1/1681 |
| 10,435,933 | B2 | * | 10/2019 | Lin ........................ G06F 1/1681 |
| 2012/0090135 | A1 | * | 4/2012 | Soh ..................... E05D 11/0081 16/250 |
| 2015/0121654 | A1 | * | 5/2015 | Novin ................... E05D 11/082 16/273 |
| 2015/0275557 | A1 | * | 10/2015 | Adair .................. E05D 11/0081 16/334 |
| 2017/0138103 | A1 | * | 5/2017 | Hong ....................... E05D 3/18 |
| 2018/0230726 | A1 | * | 8/2018 | Chen ..................... G06F 1/1681 |
| 2018/0239400 | A1 | * | 8/2018 | Lin ........................ G06F 1/1681 |
| 2018/0341295 | A1 | * | 11/2018 | Lan ....................... G06F 1/1681 |

* cited by examiner

HINGE MODULE AND ELECTRONIC DEVICE

CROSS-REFERENCE TO RELATED APPLICATION

This application claims the priority benefits of U.S. provisional application Ser. No. 62/581,040, filed on Nov. 3, 2017 and U.S. provisional application Ser. No. 62/584,891, filed on Nov. 12, 2017. The entirety of each of the above-mentioned patent applications is hereby incorporated by reference herein and made a part of this specification.

BACKGROUND

Technical Field

The invention relates to a hinge module, and more particularly to a hinge module and an electronic device applying the hinge module.

Description of Related Art

Conventional foldable electronic devices, such as laptops, which usually enables their displays to be flipped or closed relative to their bases via hinges.

In some electronic devices, to effectively form a supporting effect, it may be necessary to additionally add a torque module to generate enough torque. The additionally added a torque module may be composed of a plurality of shrapnel, pads, screw caps, which are applied additionally. If the structural design is wished not to be unobtrusive or even concealed, it is necessary to preset enough accommodating space for adding or accommodating the torque module. However, this may also enlarge the overall size, which is not only disadvantageous to the overall design, but is not compliant with the market needs that the overall design tends to be light and thin.

Another method is to generate a second by a valve. However, the flaw of this method is that the torque generated by the valve may not be adjusted.

SUMMARY

The invention provides a hinge module having a new configuration.

The invention provides an electronic device which it's buttons may be lifted and lowered along with the opening and closing of the casing.

The invention provides a hinge module, including a pair of brackets, a plurality of tabs, a torque providing assembly, and a plurality of torque adjustment members. Each of the brackets has at least one first sliding slot extending along a first direction and a first through hole extending along a second direction, wherein the first direction and the second direction are perpendicular to each other. The tabs pass through the corresponding first sliding slots, and each of the tabs has a second sliding slot extending along the second direction. The torque providing assembly has a first end and a second end, wherein one of the brackets and one of the tabs are connected to the first end, and the other one of the brackets and the other one of the tabs are connected the second end. The torque adjusting member inserts into the corresponding first through holes of the brackets and the corresponding second sliding slots of the tabs.

An electronic device of the invention includes a first casing, a second casing, the aforementioned hinge modules, a sliding sheet, and a pair of sliding rods, wherein the hinge module is connected between the first casing and the second casing. The sliding sheet is disposed corresponding to a keyboard module of the second casing, and is connected to a plurality of buttons of the keyboard module. In addition, one end of the sliding rod is connected to two of the tabs of the hinge module, and the other end of the sliding rod is connected to opposite two sides of the sliding sheet.

In view of the above, in the hinge module of the invention, with the lock of the torque adjustment member, the torque of the tabs relative to the brackets may be easily adjusted. In addition, in the moving process of the hinge module, the tabs move on a linear direction, and the sliding rod connected correspondingly between the tabs and the sliding sheet moves along with the tabs and the buttons are thus lifted and lowered during the moving process.

To make the aforementioned and other features and advantages of the invention more comprehensible, several embodiments accompanied with figures are described in detail as follows.

DESCRIPTION OF THE EXEMPLARY EMBODIMENTS

Figure 1:
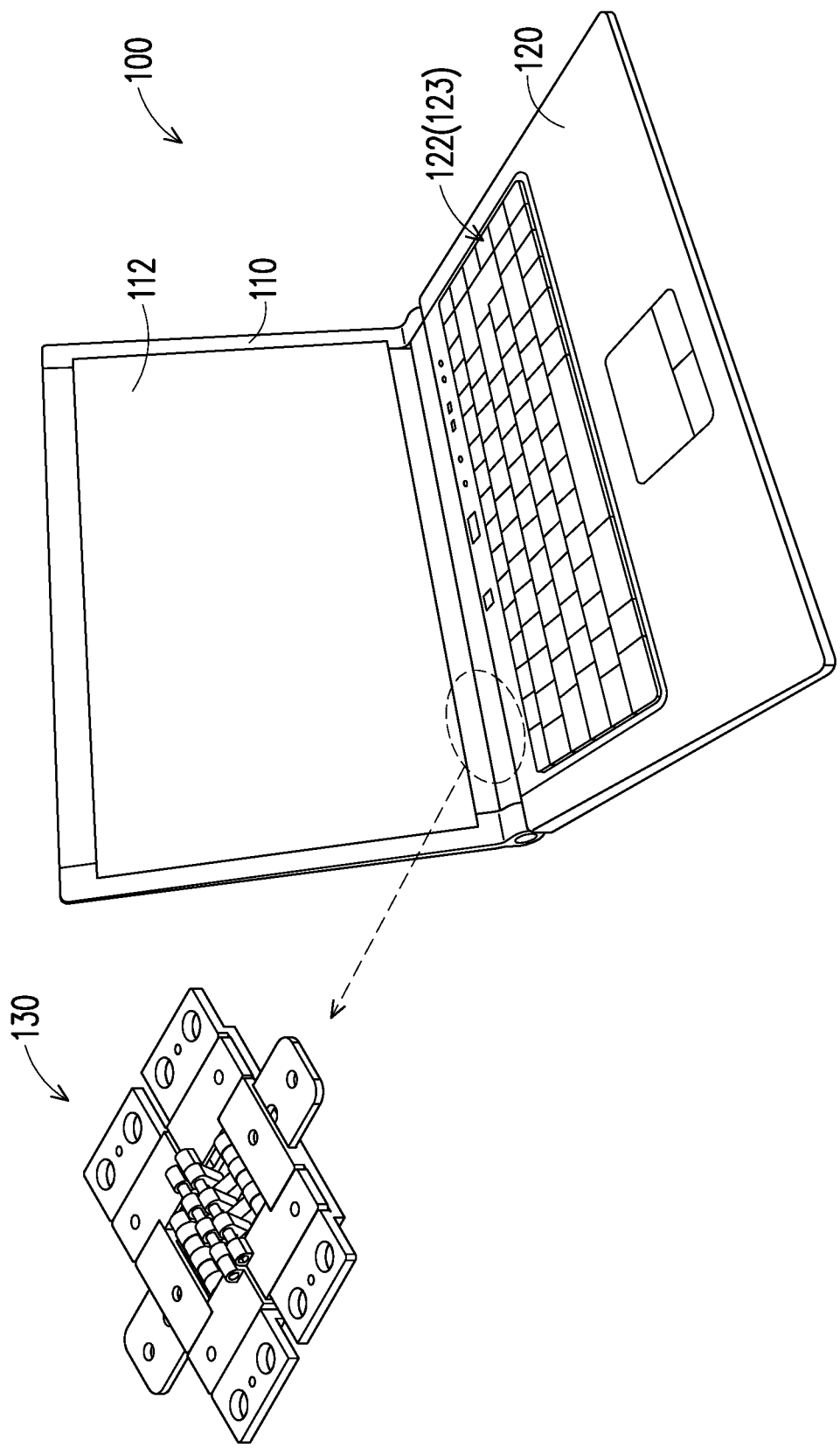
FIG. 1 is a schematic view of an electronic device of the invention.
Figure 2:
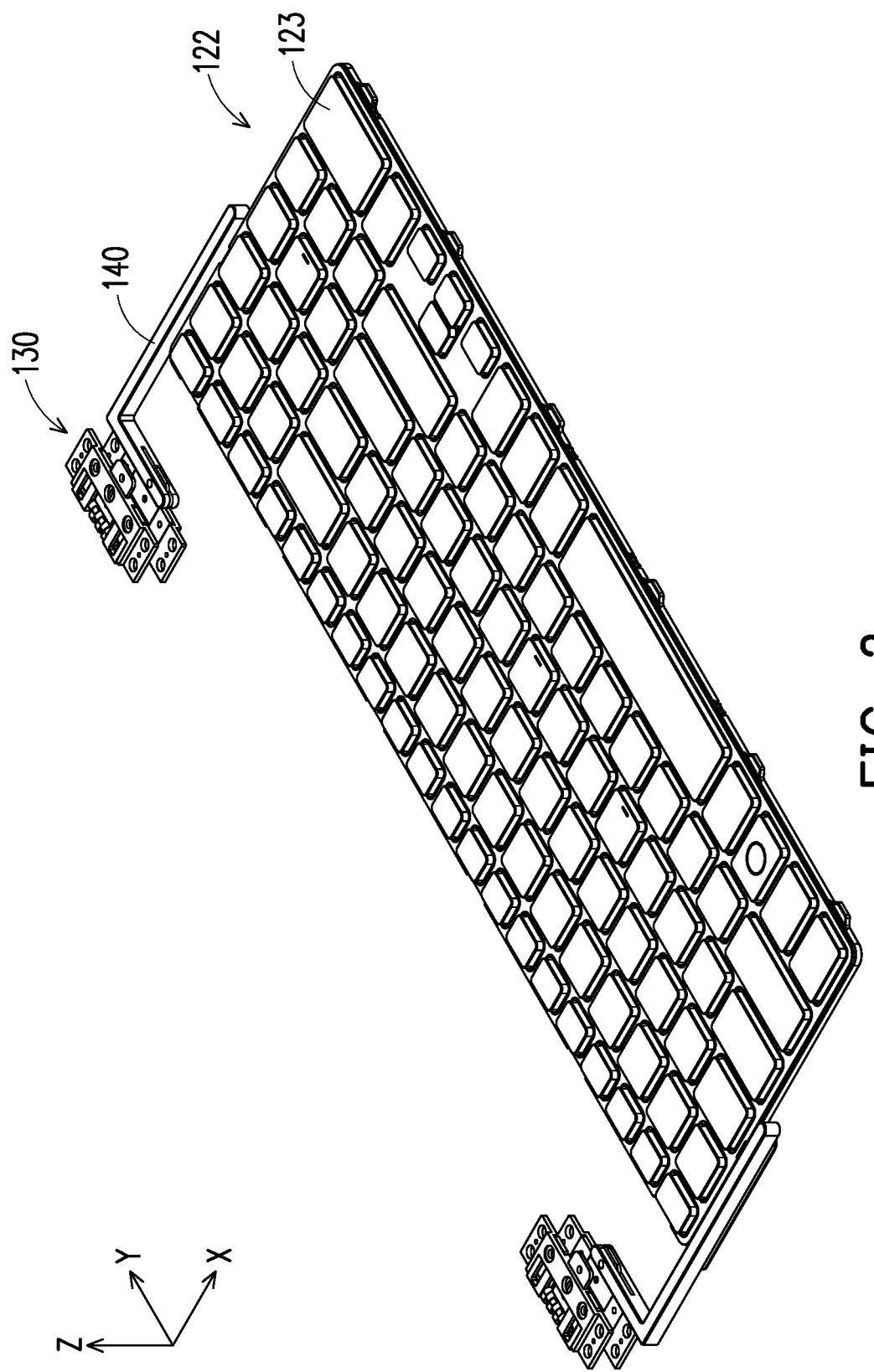
FIG. 2 is a schematic view of a hinge module of FIG. 1 connected to a keyboard module by a sliding assembly.
Figure 3:
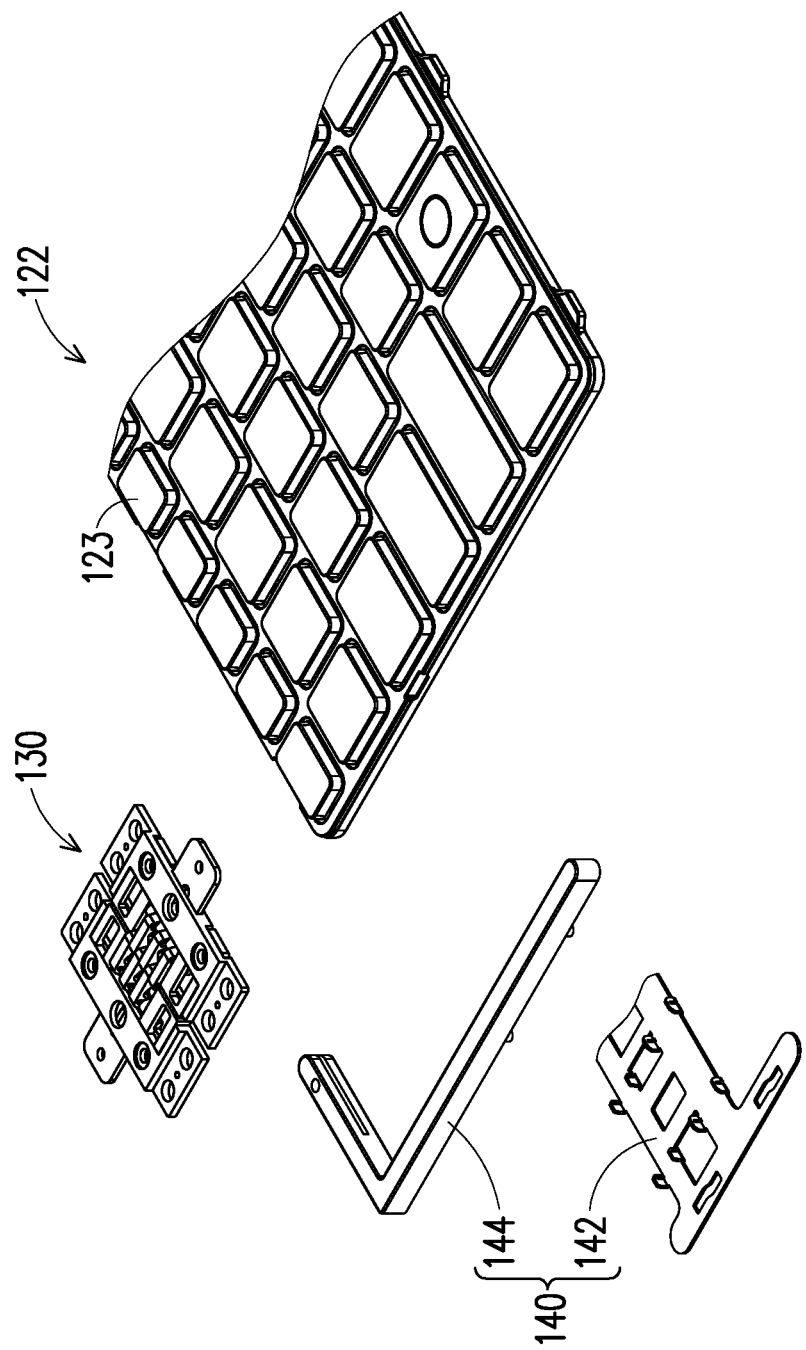
FIG. 3 is an exploded schematic view of a hinge module, a sliding assembly, and a keyboard module.

FIG. 1 is a schematic view of an electronic device of the invention. FIG. 2 is a schematic view of a hinge module of FIG. 1 connected to a keyboard module by a sliding assembly. FIG. 3 is an exploded schematic view of a hinge module, a sliding assembly, and a keyboard module, and FIG. 4 is a partial schematic view of another angle of FIG. 2.

Please refer to FIG. 1, FIG. 2, and FIG. 3 at the same time. In this embodiment, an electronic device 100 is a laptop, including a first casing 110 having a display portion 112, a second casing 120 having a keyboard module 122, a hinge module 130 connected between the first casing 110 and the second casing 120, and a sliding assembly 140 connected between the hinge module 130 and the keyboard module 122.

Figure 4:
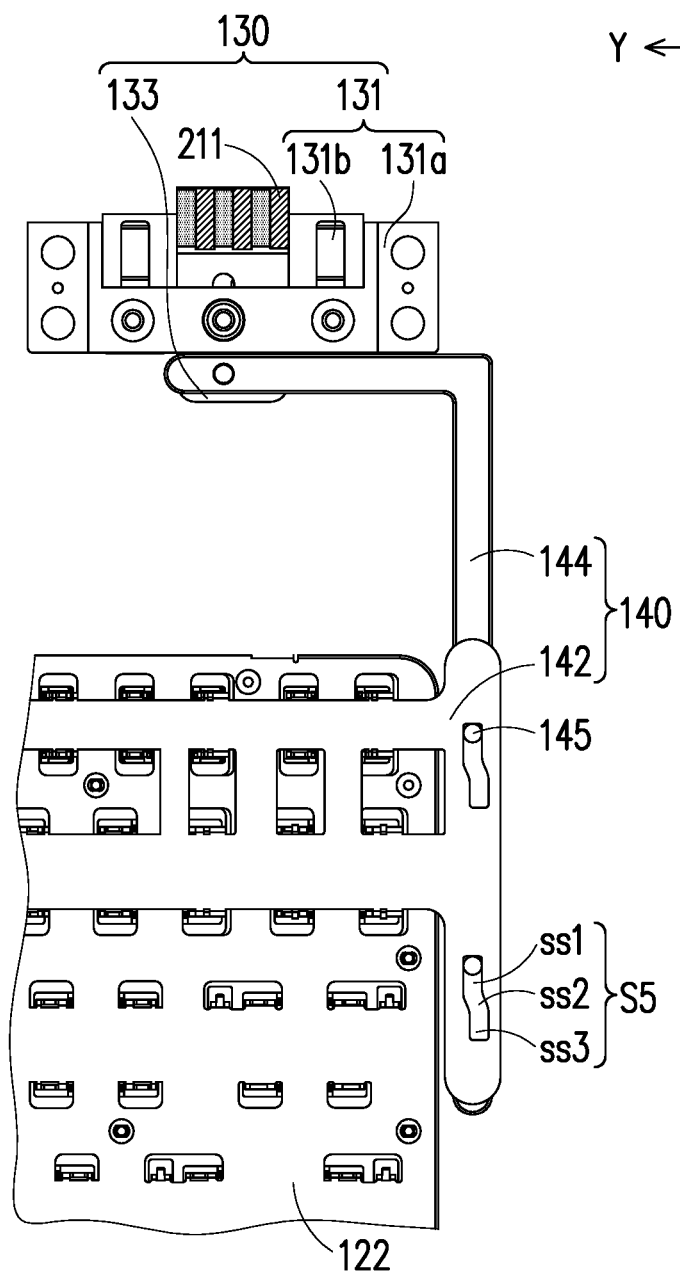
FIG. 4 is a partial schematic view of another angle of FIG. 2.

Next, please refer to FIG. 1, FIG. 2, and FIG. 4. The hinge module 130 connected between the first casing 110 and the second casing 120 may enable the first casing 110 and the second casing 120 to be relatively opened and closed. In addition, the sliding assembly 140 is disposed corresponding to the keyboard module 122 of the second casing 120, and is connected to a plurality of buttons 123 of the keyboard module 122. When the first casing 110 and the second casing 120 are relatively opened, the hinge module 130 provides a torque that the first casing 110 is fixed at a certain angle relative to the second casing 120, and at the same time, the buttons 123 of the keyboard module 122 are lifted by being driven by the sliding assembly 140. Conversely, when the first casing 110 and the second casing 120 are relatively closed, the buttons 123 of the keyboard module 122 are lowered by being driven by the hinge module 130.

Figure 5:
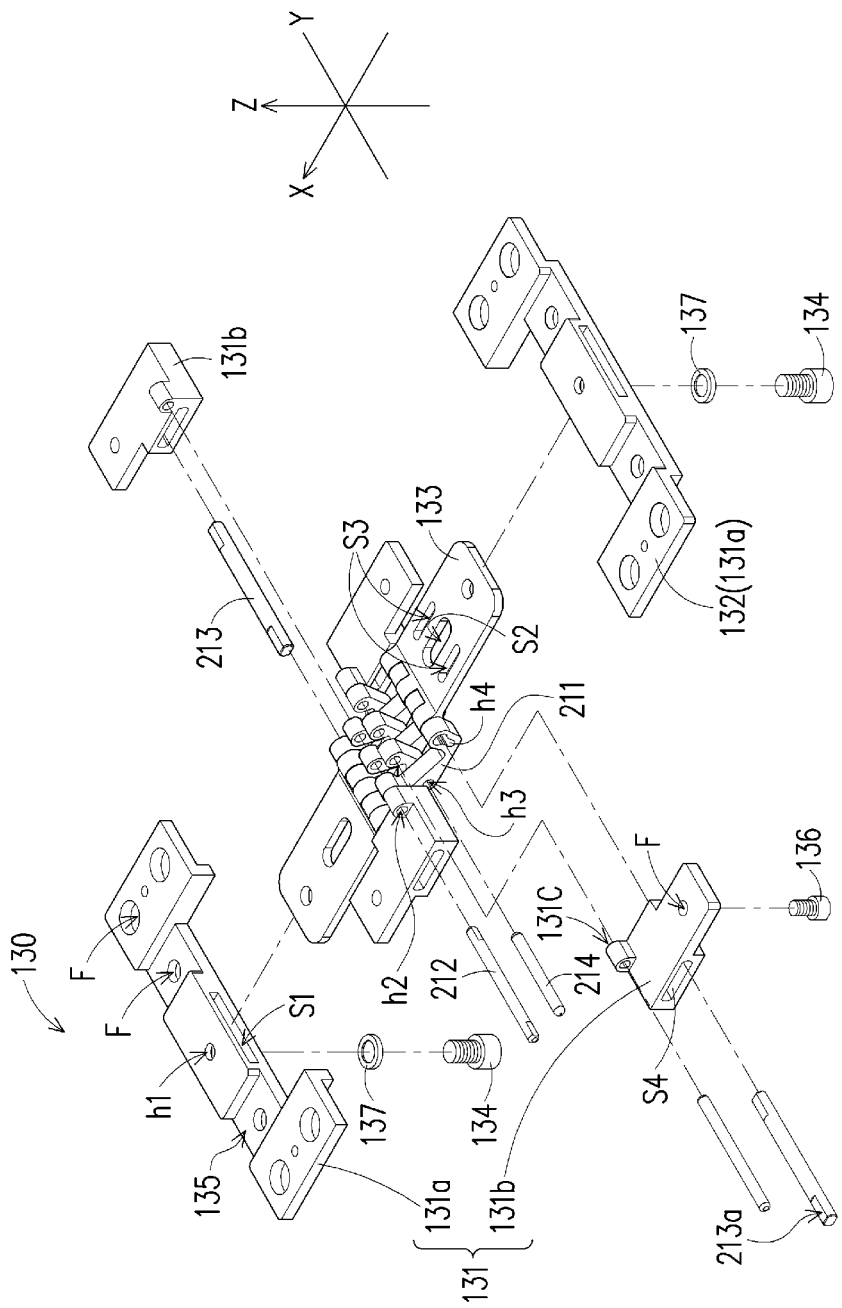
FIG. 5 is an exploded schematic view of a hinge module illustrated in FIG. 1.

FIG. 5 is an exploded schematic view of a hinge module illustrated in FIG. 1. Please refer to FIG. 5. The hinge module 130 of this embodiment includes a pair of brackets 131, 132, a plurality of tabs 133, a torque providing assembly, and a plurality of torque adjustment member 134. The torque providing assembly is connected between the two brackets 131, 132 to provide a first torque to the two brackets 131, 132. The tabs 133 are connected to two ends of the torque providing assembly, and are disposed by passing through the two brackets 131, 132. Therefore, when the two brackets 131, 132 are relatively opened or closed, the tabs 133 protrude or retract along with the angle between the brackets 131, 132. The torque adjustment member 134 is disposed to limit the movement of the plurality of tabs 133 relative to the two brackets 131, 132, and adjust a second torque between the plurality of tabs 133 and the two brackets 131, 132.

With a view to the above, each of the brackets 131, 132 has at least one first sliding slot S1 extending along a first direction X, and a first through hole h1 extending along a second direction Z, wherein the first direction X and the second direction Z are perpendicular to each other, and the tabs 133 are disposed passing corresponding through the first sliding slot S1.

In detail, each of the brackets 131, 132 may include a bracket body 131a and a pair of first fixing blocks 131b. The aforementioned first sliding slot S1 and the first through hole h1 are disposed in the bracket body 131a, and the bracket body 131a may further have a pair of first fixing slots 135 on the opposite sides of the first sliding slot S1, wherein the first fixing slots 135 is disposed to accommodate a first fixing block 131b. The bracket body 131a may have a plurality of locking holes F, and the locking hole F may also be disposed on the first fixing block 131b. Therefore, by inserting a fixing member 136, for example, a screw or a screw bolt, into the corresponding locking hole F to combine the bracket body 131a with the first fixing block 131b.

It should also be mentioned that the fixing member 136 may also pass through the rest of locking holes F on the bracket body 131a, and insert into the first casing 110 or the second casing 120 correspondingly, so that the hinge module 130 is fixed onto the first casing 110 and the second casing 120.

The tabs 133 disposed to pass through the corresponding first sliding slot S1 has the second sliding slots S2 extending along a second direction Z, wherein an orthographic projection of the first through hole h1 of the brackets 131, 132 overlaps with the scope of the second sliding slots S2 of the tabs 133. In addition, the torque adjustment member 134 inserts into the first through hole h1 of the bracket body 131a and the second sliding slots S2 of the tabs 133 correspondingly, so that the tabs 133 may be able to perform linear movement in the first sliding slot S1 along the first direction X. In this embodiment, the torque adjustment member 134 may be the same as the fixing member 136, the screw may be selected, and the insertion degree of the screw may change the second torque of the first sliding slot S1 relative to the tabs 133.

Besides, a plurality of storing slots S3 may be disposed on a surface of a slot wall of the first sliding slot S1 contacted with the tabs 133. The storing slots S3 are disposed to accommodate lubricating liquid. The lubricating liquid may reduce the friction between the tabs 133 and the slot wall of the first sliding slot S1. In other words, applying the lubricating liquid may be a method of adjusting the second torque.

The torque providing assembly has a first end and a second end, wherein the bracket 131 and one of the tabs 133 are connected to the first end and the bracket 132 and another one of the tabs 133 are connected to the second end. Therefore, when the two brackets 131, 132 are opened to each other, a certain angle is fixed by the torque provided by the torque providing assembly. In addition, with the changes of the angle between the two brackets 131, 132, the length of the tabs 133 protruding from the first sliding slot S1 changes accordingly.

In detail, the torque providing assembly includes a plurality of linkage arms 211, a plurality of fixing shafts 212, a plurality of sliding axis 213, and a plurality of shared shafts 214. The linkage arms 211 are mostly in shapes of boomerangs, and each of the linkage arms 211 has a second through hole h2, a third through hole h3, and a fourth through hole h4, wherein the third through hole h3 is located between the second through hole h2 disposed between the two ends of the linkage arms 211 and the fourth through hole h4, mostly located in the middle of the linkage arms 211. The fixing shaft 212 passes through the second through hole h2 correspondingly, wherein the second through hole h2 is a C-axis hole, and two ends of the fixing shaft 212 inserts to the corresponding brackets 131, 132, so that the linkage arms 211 are initially rotatably connected to the brackets 131, 132.

Moreover, each of the first fixing blocks 131b has a fixing shaft hole 131c, and the two ends of the fixing shaft 212 inserts into the corresponding fixing shaft hole 131c, so that the torque providing assembly may be connected to the brackets 131, 132 in a manner of rotating relative to the bracket body 131a.

Figure 5A:
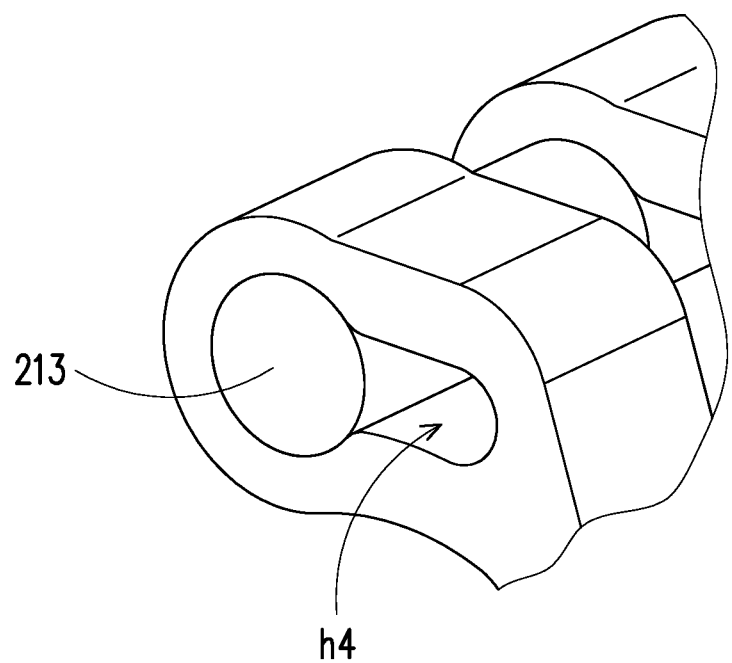
FIG. 5A is an enlarged schematic view of a fourth through hole illustrated in FIG. 5.

The sliding axis 213 passes corresponding through the fourth through hole h4 and a through hole (not illustrated) of the tabs 133, wherein the fourth through hole h4 is a scoop-shaped shaft hole (as illustrated in FIG. 5A, FIG. 5A being an enlarged schematic view of a fourth through hole illustrated in FIG. 5), and two ends of the sliding axis 213 inserts into the corresponding brackets 131, 132, so that the tabs 133 may be fixed to the bracket body 131a in a manner of linear moving along the first direction X in the first sliding slot S1. The shared shaft 214 passes through the third through hole h3 correspondingly, so that all the linkage arms 211 are connected together.

It should be noted that, the scoop-shaped shaft hole (as illustrated in FIG. 5A) and the sliding axis 213 inserted therein generate the first torque by mutual interference with each other, wherein since the shape of the scoop-shaped shaft hole (as shown in FIG. 5A) provides a space for deformation, the first torque would not be too big to bring about inconveniences. The scoop-shaped shaft hole here indicates a shaft hole having a round hole for the sliding axis 213 to insert, and an opening from one side of the round hole to a long-oval hole connected to the round hole. The shape of the opening may not be limited to the shapes illustrated in this embodiment. People skilled in the art in the art may change the shape of the opening based on actual needs.

Furthermore, the shape of the linkage arms 211 are the same. However, the linkage arms 211 are not symmetrical structures centered on the third through hole h3. To achieve force balance, the quantity of the linkage arms 211 may thus be plural. In addition, along the axis of the shared shaft 214, the linkage arms 211 are staggered with the shared shaft 214 as a symmetrical centerline. The staggered disposition here is, for example, that the second through hole h2 of a singular quantity of the linkage arm 211 is disposed on the left side of the shared shaft 214, and the second through hole h2 of a plural quantity of the plurality of linkage arms 211 is disposed on the right side of the shared shaft 214.

In view of the above, each of the first fixing blocks 131b has a third sliding slot S4. The third sliding slot S4 extends along a third direction Y, and the third direction Y are perpendicular to the second direction Z as well as the first direction X, wherein the two ends of the sliding axis 213 insert into the third sliding slot S4 correspondingly. The third sliding slot S4 is roughly flat, and the two ends of the sliding axis 213 both have parallel columns 213a conformed to the third sliding slot S4. By this structure disposition manner, the ends of the sliding axis 213 may only perform linear movement in the third sliding slot S4 to avoid the occurrence of self-rotation of the sliding axis 213. Conversely, if the end of the sliding axis 213 is circular, while the end of the sliding axis 213 is moving in the third sliding slot S4, the self-rotation of the sliding axis 213 may occur.

The hinge module 130 further includes a torque adjustment ring 137 disposed in the first through hole h1, wherein the torque adjustment member 134 passes through the torque adjustment ring 137 correspondingly to insert into the first through hole h1 of the bracket body 131a and the second sliding slots S2 of the tabs 133 to generate the second torque. By the insertion degree of the torque adjustment member 134, the second torque is adjusted.

Figure 6:
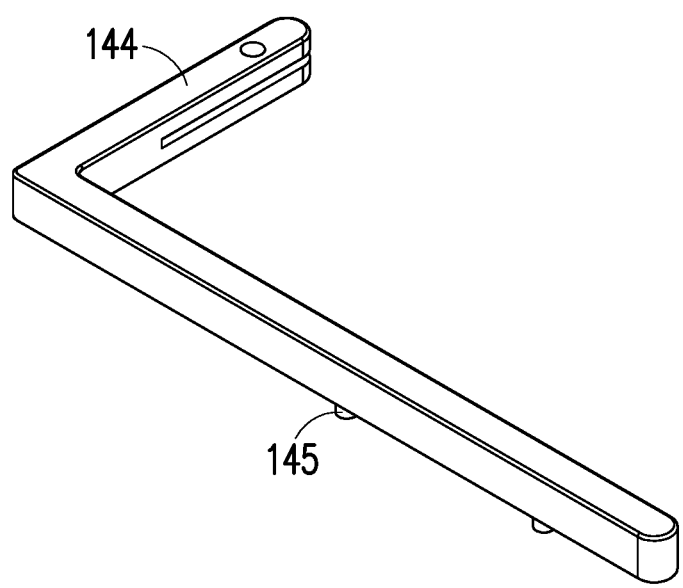
FIG. 6 is a schematic view of a sliding rod.
Figure 7:
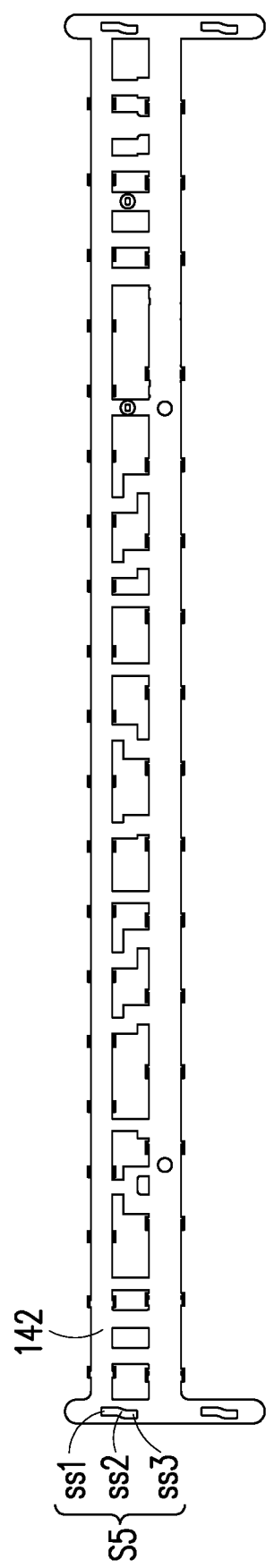
FIG. 7 is a schematic view of a sliding sheet.

FIG. 6 is a schematic view of a sliding rod, and FIG. 7 is a schematic view of a sliding sheet. Please refer to FIG. 4, FIG. 6, and FIG. 7 at the same time. The sliding assembly 140 includes a sliding sheet 142 and a pair of sliding rods 144. One end of the sliding rods 144 is connected to the tabs 133 of the hinge module 130, and the other end of the sliding rods 144 is connected to the two sides of the sliding sheet 142.

In detail, the sliding sheet 142 has sliding slots S5 disposed on two sides. The sliding rods 144 have a sliding column 145, and the sliding column 145 inserts corresponding into the sliding slot S5. Each of the sliding slots S5 has two parallel portions ss1, ss3 parallel to the first direction X and staggered from each other on the third direction Y, and a connecting portion ss2 obliquely connected between the parallel portions ss1, ss3. When the sliding rods 144 are driven by the hinge module 130, the sliding sheet 142 moves along the third direction Y by the cooperation of the sliding column 145 and the sliding slot S5. The sliding sheet 142 is thus driven by the keyboard 123 connected thereto to be lifted or lowered.

Figure 8:
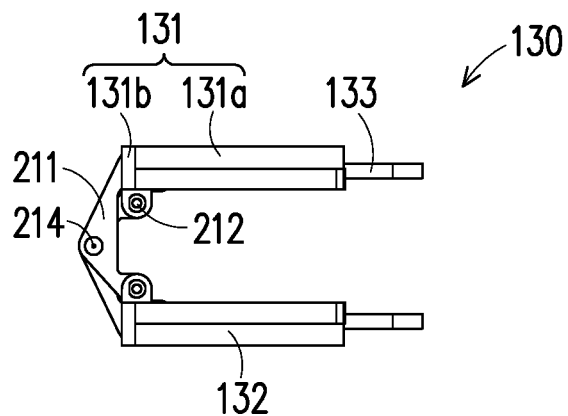
FIG. 8 is a schematic view of a hinge module when a first casing is closed relative to a second casing.
Figure 9:
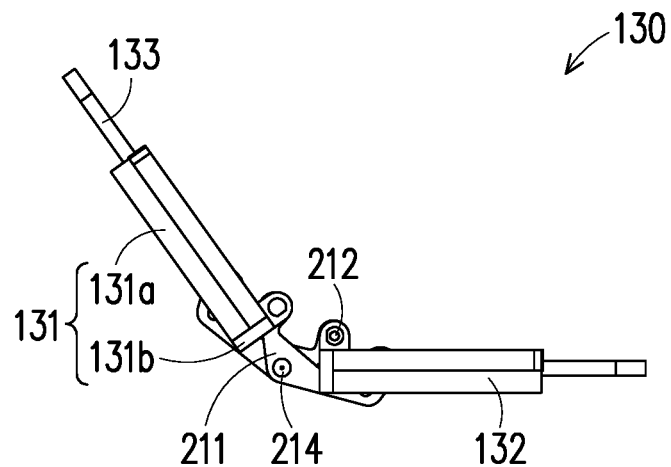
FIG. 9 is a schematic view of a hinge module when a first casing is opened relative to a second casing.
Figure 10:
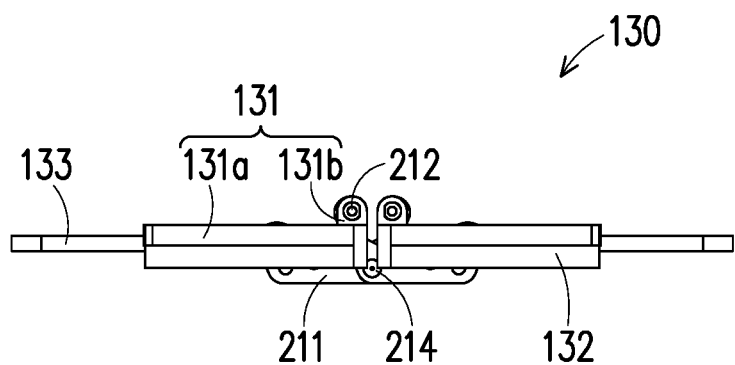
FIG. 10 is a schematic view of a hinge module when a first casing is fully opened to 180 degrees relative to a second casing.
Figure 11:
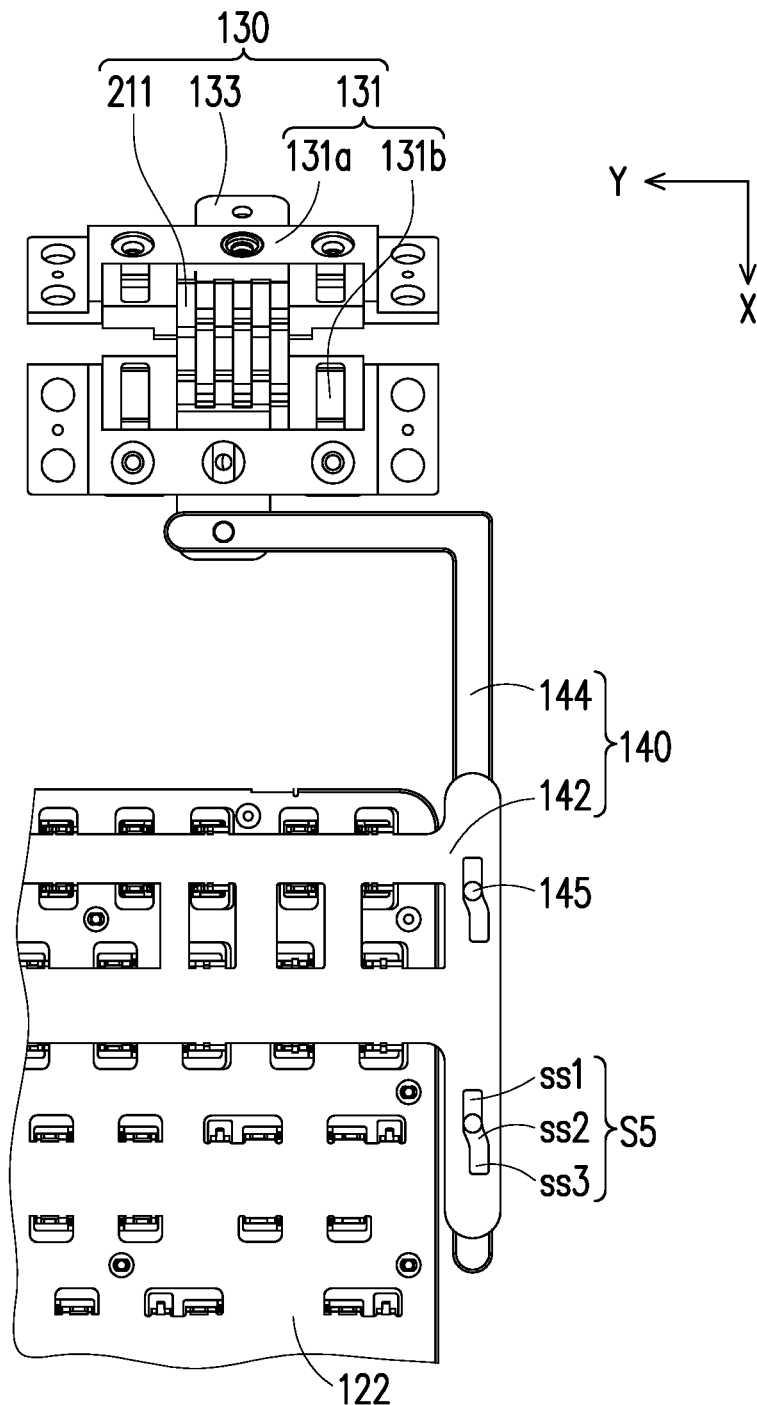
FIG. 11 is a schematic view of a hinge module, a sliding assembly, and a keyboard module of FIG. 9.
Figure 12:
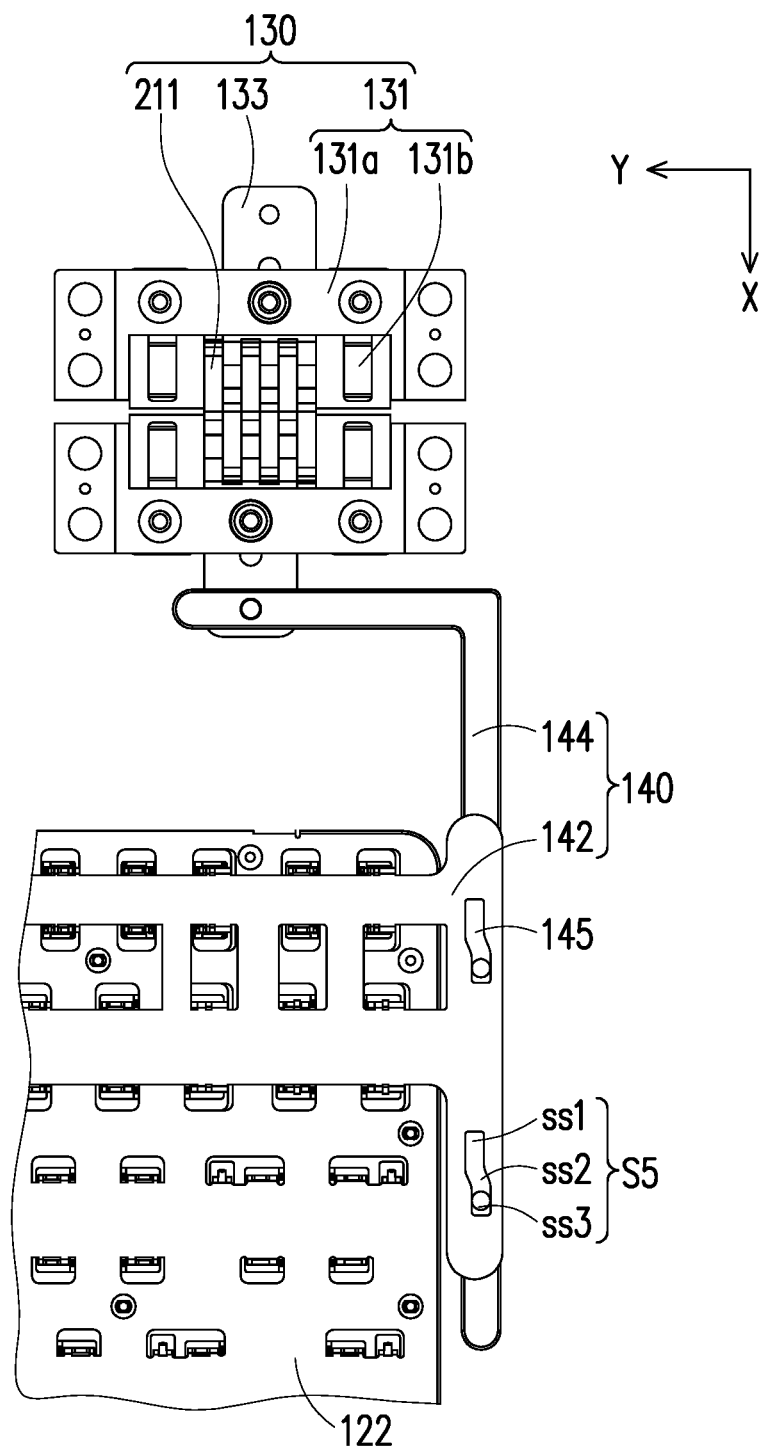
FIG. 12 is a schematic view of a hinge module, a sliding assembly, and a keyboard module of FIG. 8.
Figure 13:
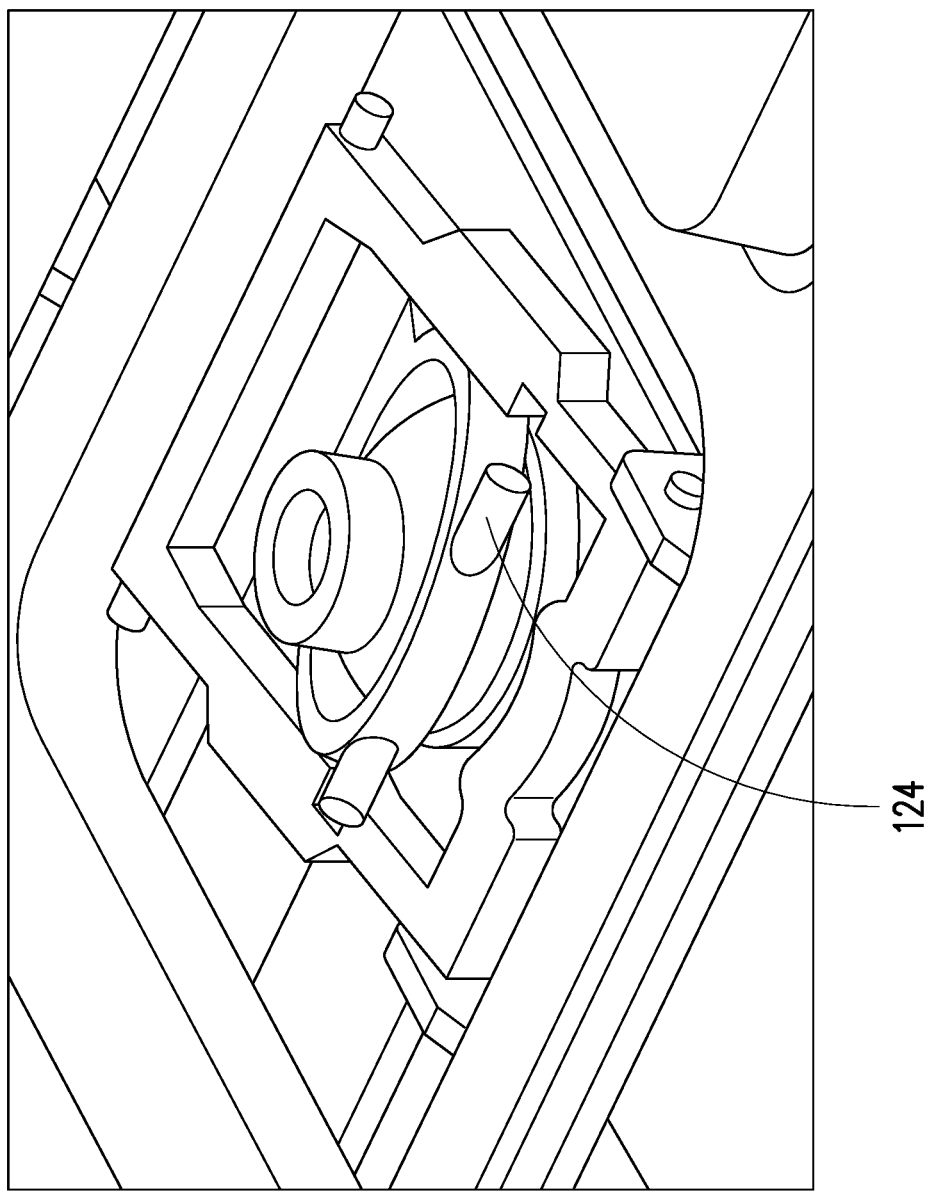
FIG. 13 is a schematic view of a linkage component disposed on the keyboard to be connected to a sliding sheet.

FIG. 8 is a schematic view of a hinge module when a first casing is closed relative to a second casing. FIG. 9 is a schematic view of a hinge module when a first casing is opened relative to a second casing, and FIG. 10 is a schematic view of a hinge module when a first casing is fully opened to 180 degrees relative to a second casing. FIG. 11 is a schematic view of a hinge module, a sliding assembly, and a keyboard module of FIG. 9. FIG. 12 is a schematic view of a hinge module, a sliding assembly, and a keyboard module of FIG. 8. FIG. 13 is a schematic view of a linkage component disposed on the keyboard to be connected to a sliding sheet.

Please refer to FIG. 1, FIG. 8, and FIG. 9 at the same time. Generally, the counterweight of the second casing 120 is heavier than the weight of the first casing 110. Therefore, when the first casing 110 of the electronic device 100 (as illustrated in FIG. 1) is slowly opened from a closed state relative to the second casing 120 (as illustrated in FIG. 1), the bracket 132 connected to the second casing 120 (as illustrated in FIG. 1) rotates relatively to the brackets 131 connected to the first casing 110 with the shared shaft 214 as a rotation axis.

The two brackets 131, 132 and the tabs 133 are connected together by the torque providing assembly. When the bracket 131 rotates relative to the bracket 132, the shared shaft 214 is relatively opened as a rotating shaft. At the same time, since one end of the linkage arms 211 passes through the second through hole h2 of the linkage arms 211 by the fixing shaft 212, and inserts into a fixing shaft hole 131c of the first fixing block 131b. The other end of the linkage arms 211 passes through the fourth through hole h4 of the linkage arms 211 and an insertion hole (not illustrated) of the tabs 133 and inserts into the third sliding slot S4 by the sliding axis 213. Therefore, when the two brackets 131, 132 are relatively opened to the brackets 131, 132 with the shared shaft 214 as the rotating shaft, the linkage arms 211 rotate with one end connected to the brackets 131, 132 and the other end rotates with the rotation of the brackets 131, 132. In addition, with the rotation of the linkage arms 211, the sliding shaft 213 moves linearly of the first fixing block 131b in the third sliding slot S4, and the tabs 133 are driven by the linking arm 211 so as to perform linear movement in the first sliding slot S1.

It should also be mentioned, when the bracket 131 is opened relative to the bracket 132, the cooperation of the sliding shaft 213 and the fourth through hole h4 provides enough of the first torque, so that the two brackets 131, 132 may be fixed at a certain angle. Additionally, by adjusting the degree to which the torque adjustment member 134 is locked into the first through hole h1 of the brackets 131, 132 and the second sliding slots S2 of the tabs 133 by the torque adjustment ring 137, the second torque generated by the tabs 133 and the first sliding slot S1 may be adjusted. The first torque and the second torque are provided, so that the first casing 110 (as illustrated in FIG. 1) may be fixed relative to the second casing 120 (as illustrated in FIG. 1) at an angle desired by the user.

In accordance with the above, it may be seen from FIG. 8 and FIG. 9 that the length of the tabs 133 protruding from the first sliding slot S1 lengthens as the relative angle between the brackets 131, 132 increases. In addition, as illustrated in FIG. 4 and FIG. 11, at the same time, the sliding rods 144 connected to the tabs 133 are driven by the tab 133 to move along the first direction X, and the sliding column 145 located in the sliding slot S5 of the sliding sheet 142 enters into the connecting portion ss2 from the parallel portion ss1 of the sliding slot S5, and the sliding sheet 142 is further driven to move along the second direction Z.

Please refer to FIG. 4, FIG. 11, and FIG. 13 at the same time. The sliding sheet 142 interferes with the structure of the linkage component 124 disposed on the buttons 123. Therefore, when the sliding sheet 142 moves along the second direction Z, the linkage component 124 is driven at the same time, and the buttons 123 of the keyboard module 122 are thus lifted.

Next, please refer to FIG. 9 and FIG. 10. The greater the angle between the two brackets 131, 132 opened to each other is, the longer the length of the tabs 133 protruding from the first sliding slot S1 is. As illustrated in FIG. 12, the sliding column 145 enters into the next parallel portion ss3 from the parallel portion ss1 as illustrated in FIG. 4 by the connecting portion ss2, and the buttons 123 of the keyboard module 122 maintains lifted.

It should be mentioned that the drawings of the invention allow the readers to clearly understand the spirit of the invention, FIG. 10 illustrates an exaggerated angle of the two brackets 131, 132. However, when a general user uses the laptop, the angle of the first casing 110 (as illustrated in FIG. 1) relative to the second casing 120 (shown in FIG. 1) (i.e., the angle at which the two brackets 131, 132 are opened) is generally between 60 and 135 degrees. The degrees, which is greater than 135 degree or smaller than 60 degrees, are not convenient for the user to use.

When the first casing 110 is closed relative to the second casing 120, the two brackets 131, 132 may be close to each other according to the order of FIG. 9 and FIG. 8. And as FIG. 12, FIG. 11, and FIG. 4, the sliding column 145 returns from the next parallel portion ss3 to the previous parallel portion ss1 by the connecting portion ss2, and simultaneously drives the sliding sheet 142 and the linkage component 124 disposed on the buttons 123 to return to the original state, and the buttons 123 are lowered.

According to the above, it may be understood that the electronic device 100 of this embodiment may lift the buttons by the cooperation of the hinge module 130 and the sliding assembly 140 when the first casing 110 having the display portion 112 is opened by the user relative to the second housing 120 having the keyboard module 122. Here is no need to additionally dispose a mechanical activating mechanism (such as button activation), or an electronic activating mechanism (such as software activation) to lift the buttons 123. Therefore, it is convenient for the user.

Second Embodiment

Figure 14:
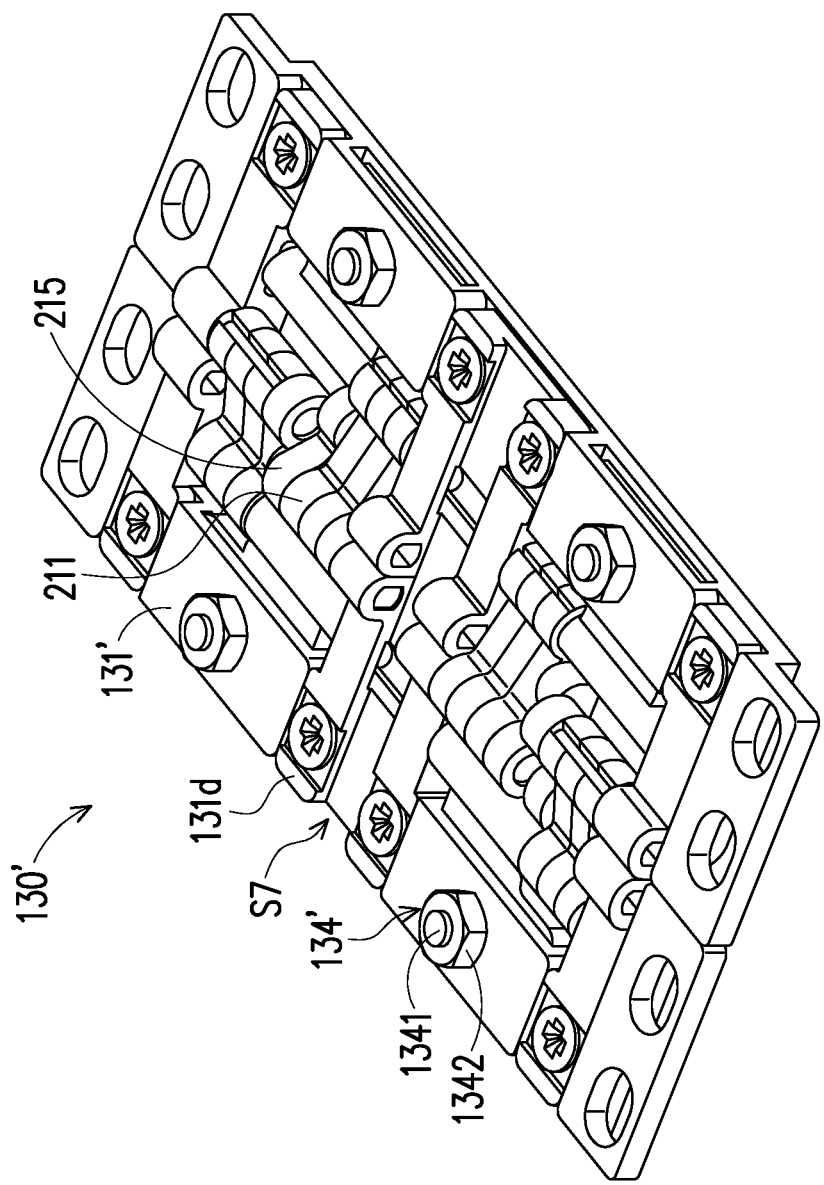
FIG. 14 is a schematic view of a hinge module of the second embodiment of the invention.
Figure 15:
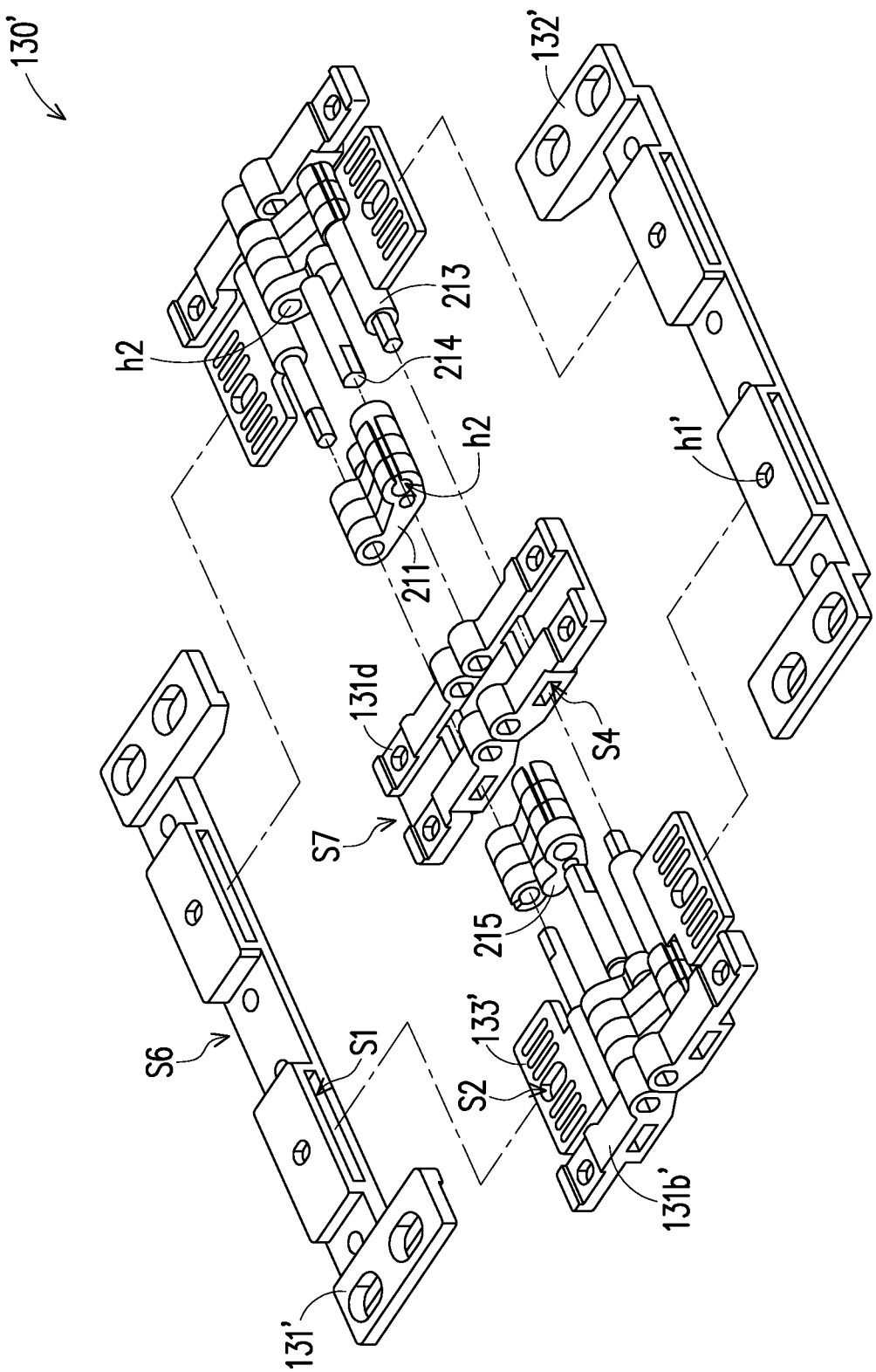
FIG. 15 is an exploded schematic view of FIG. 14.

FIG. 14 is a schematic view of a hinge module of the second embodiment of the invention, and FIG. 15 is an exploded schematic view of FIG. 14, wherein, to be concise, a plurality of screws and screw caps of FIG. 14 are omitted in FIG. 15.

Please refer to FIG. 14 and FIG. 15 at the same time. This embodiment is mostly the same as the previous embodiment, and the difference between this embodiment and the aforementioned first embodiment is that the deposition quantity of the at least one first sliding slot S1 is greater than or equal to 2, and a second fixing slot S6 is disposed between any two of the first sliding slots S1 adjacent to each other, and each of the brackets 131', 132' further comprises a second fixing block 131d, disposed on the second fixing slot S6.

It should be mentioned that the second fixing slot 131d may have a wire receiving slot S7. Therefore, a cable or a ribbon cable of the electronic device 100 (as illustrated in FIG. 1) may be accommodated into the wire receiving slot S7.

In addition, a hinge module 130' of this embodiment has four or more sets of the torque providing assemblies, wherein the shapes of the linkage arms 211 of the first embodiment are the same. However, when the torque providing assembly is formed, the linkage arms 211 are staggered to each other. That is, one of the linkage arms 211 disposed in the opposite direction is disposed between two of the linkage arms 211 disposed in the same direction. However, in this embodiment, two of the torque providing assemblies located at the same side of the first fixing block 131b' are staggered in the opposite direction to each other.

In detail, two sets of the torque providing assemblies are disposed between the first fixing block 131b' and the second fixing block 131d, wherein the second through hole h2 of the linkage arm 211 of one set of the torque providing assemblies is located at left side of the shared shaft 214, and the second through hole h2 of the linkage arm 211 of the other set of the torque providing assemblies is located at right side of the shared shaft 214.

In response to the aforementioned structural changes, one end of sliding axis 213 of the torque providing assembly inserts into the third sliding slot S4 of the second fixed block 131d correspondingly, but the fixing shaft 212 is applied as a cantilever. Therefore, each set of the torque providing assembly may further include an auxiliary arm 215, and the shared axis 214 passes through the auxiliary arm 215. As illustrated in FIG. 15, the auxiliary arm 215 may be located between the two sets of the torque providing assemblies. However, in other embodiments, the disposition manner of the two sets of the torque providing assemblies may be changed. Therefore, the location of the auxiliary arm 215 may change based on needs.

The fixing shafts 212 and the shared axis 214 is supported to each other by the deposition of the auxiliary arm 215 to increase the strength of the torque providing assembly.

It should be mentioned that since the screws are selectively applied in the torque adjustment member 134 of the first embodiment, with the tabs 133 linearly moving back and forth in the first sliding slot S1, the screws may be driven to rotate and resulted in loosening. In contrast, a circular hole of a first through hole h1' of this embodiment may be changed to an elongated hole, and a screw column 1341 and a screw cap 1342 may be applied in a torque adjustment member 134', wherein the screw column 1341 is an immovable part having a flat surface or a screw (that is, non-circular). Therefore, after the screw column 1341 passes through the first through hole h1' and the second sliding slots S2 of the tabs 133', the screw column 1341 is located in the first through hole h1' in the shape of an elongated hole correspondingly. The screw cap 1342 fixes the screw column 1341 from two ends of the screw column 1341 to increase the pressing friction so as to generate the second torque. In addition, the cooperation of the screw column 1341 and the screw cap 1342 may prevent the screw from loosening due to the linear movement of the tabs 133'. Moreover, the mutual cooperation of shapes of the non-circular first through hole h1' and the screw column 1341 may limit the screw column 1341, and prevent the screw column 1341 from being affected by rotating relative to the first through hole h1'.

In summary of the above, the structure of the hinge module of the present invention is different from the structure of the conventional hinge module. In addition, the hinge module forms interference with the keyboard module through the sliding assembly. Moreover, when the user may open or close the first casing and the second casing of the electronic device, the buttons may be lifted or lowered by being driven by the hinge module, and is convenient for the user to use.

It will be apparent to those skilled in the art that various modifications and variations can be made to the disclosed embodiments without departing from the scope or spirit of the invention. In view of the foregoing, it is intended that the invention covers modifications and variations of this invention provided that they fall within the scope of the following claims and their equivalents.

What is claimed is:

1. A hinge module, comprising:
a pair of brackets, wherein each of the brackets has a first sliding slot extending along a first direction and a first through hole extending along a second direction, wherein the first direction and the second direction are perpendicular to each other;
a plurality of tabs, passing through the corresponding first sliding slots and sandwiched by an upper wall and a lower wall of the corresponding first sliding slots, the plurality of tabs moving linearly in the first sliding slot along the first direction, and each of the tabs has a second sliding slot extending along the second direction;
a torque providing assembly, having a first end and a second end, wherein one of the pair of brackets and one of the tabs are connected to the first end, and the other one of the brackets and the other one of the tabs are connected to the second end, and the torque providing assembly provides a first torque; and
a plurality of torque adjusting members, inserting into the corresponding first through holes of the brackets and the corresponding second sliding slots of the tabs along the second direction, a second torque is generated by the upper wall and the lower wall sandwiching the corresponding tabs in the second direction,
wherein by adjusting an insertion degree of the torque adjusting member, a spacing occupied by the first sliding slot changes, and the second torque is adjusted.

2. The hinge module as claimed in claim 1, wherein when the pair of brackets are opened to each other, a certain angle is fixed by torque provided by the torque providing assembly, and with the changes of the angle between the pair of brackets, the length of the pair of tabs protruding from the first sliding slots changes accordingly.

3. The hinge module as claimed in claim 1, wherein the torque providing assembly comprises:
a plurality of linkage arms, each of the linkage arms having a second through hole, a third through hole, and a fourth through hole, wherein the third through hole is located between the second through hole and the fourth through hole;
a plurality of fixing shafts, passing through the corresponding second through holes, and two ends of the fixing shafts inserting into the corresponding brackets;
a plurality of sliding axis, passing through the corresponding fourth through holes, and two ends of the sliding axis inserting into the corresponding brackets; and
a plurality of shared shafts, passing through the corresponding third through holes.

4. The hinge module as claimed in claim 3, wherein the second through holes are C-axis holes.

5. The hinge module as claimed in claim 3, wherein the fourth through holes are scoop-shaped shaft holes.

6. The hinge module as claimed in claim 3, wherein each of the brackets comprises:
a bracket body, having the at least one first sliding slot and the first through hole, and further having a pair of first fixing slots, wherein the pair of first fixing slots is located at two sides of the at least one first sliding slot; and
a pair of first fixing blocks, disposed corresponding on the pair of first fixing slots.

7. The hinge module as claimed in claim 6, wherein each of the first fixing blocks has a third sliding slot, the third sliding slots extend along a third direction, the third direction and the second direction as well as the first direction are perpendicular to each other, and two ends of the sliding axis insert into the corresponding third sliding slot.

8. The hinge module as claimed in claim 7, wherein each end of the sliding axis has a parallel column, conformed to the third sliding slot, and the end of the sliding axis only moves linearly in the third sliding slot.

9. The hinge module as claimed in claim 6, wherein each of the first fixing blocks has a fixing shaft hole, and two ends of the fixing axis insert into the corresponding fixing shaft holes.

10. The hinge module as claimed in claim 6, wherein the deposition quantity of the at least one first sliding slot is greater than or equal to 2, and a second fixing slot is disposed between any two of the first sliding slots adjacent to each other, and each of the brackets further comprises a second fixing block, disposed on the second fixing slot.

11. The hinge module as claimed in claim 10, wherein the second fixing slot has a wire receiving slot.

12. The hinge module as claimed in claim 10, wherein the torque providing assembly further comprises an auxiliary arm, and the shared axis passes through the auxiliary arm.

13. The hinge module as claimed in claim 1, wherein a plurality of storing slots are further disposed on a surface of a slot wall of the first sliding slot contacted with the tabs.

14. The hinge module as claimed in claim 1, further comprising a plurality of torque adjustment rings, disposed on the first through holes, and the torque adjustment members passing through the torque adjustment rings correspondingly to insert into the first through holes of the brackets and the second sliding slots of the tabs.

15. An electronic device, comprising:
a first casing, having a display portion;
a second casing, having a keyboard module;
a pair of hinge modules, connected between the first casing and the second casing, a sliding sheet, disposed corresponding to the keyboard module of the second casing, and connected to a plurality of buttons of the keyboard module; and
a pair of sliding rods, one end of the sliding rods connected to the pair of hinge modules, and the other end of the sliding rods connected to opposite two sides of the sliding sheet;
wherein each of the hinge modules comprises:
a pair of brackets, wherein one of the brackets is connected to the first casing, and the other one of the brackets is connected to the second casing, each of the brackets has at least one first sliding slot extending along a first direction and a first through hole extending along a second direction, wherein the first direction and the second direction are perpendicular to each other;
a plurality of tabs, passing through the corresponding first sliding slots and sandwiched by an upper wall and a lower wall of the corresponding first sliding slots, the plurality of tabs moving linearly in the first sliding slot along the first direction, and each of the tabs has a second sliding slot extending along the second direction;

a torque providing assembly, having a first end and a second end, wherein one of the pair of brackets and one of the tabs are connected to the first end, and the other one of the brackets and the other one of the tabs are connected to the second end, and the torque providing assembly provides a first torque; and a plurality of torque adjusting members, inserting into the corresponding first through holes of the brackets and the corresponding second sliding slots of the tabs along the second direction, a second torque is generated by the upper wall and the lower wall sandwiching the corresponding tabs in the second direction, wherein by adjusting an insertion degree of the torque adjusting member, a spacing occupied by the first sliding slot changes, and the second torque is adjusted.

16. The electronic device as claimed in claim 15, wherein the sliding sheet has a pair of sliding slots, and each of the sliding slots has a sliding column, and the sliding columns are disposed in the corresponding sliding slots.

17. The electronic device as claimed in claim 15, wherein each of the sliding slots has two parallel portions parallel to the first direction and staggered to each other on a third direction, and has a connecting portion connected between the parallel portions, the third direction and the second direction as well as the first direction are perpendicular to each other.

18. The electronic device as claimed in claim 15, wherein one ends of the sliding rods are connected to two of the tabs of the pair of hinge modules, and the other ends of the sliding rods are connected to opposite two sides of the sliding sheet.

19. The electronic device as claimed in claim 15, wherein when the first casing and the second casing are opened relatively to each other, with the length changes of the tabs of the hinge module protruding from the first sliding slots, the pair of sliding rods are driven, so that the sliding sheet moves relative to the keyboard module, and the buttons disposed in the keyboard module are lifted.

* * * * *